United States Patent
Bokhari

(10) Patent No.: US 7,397,320 B1
(45) Date of Patent: Jul. 8, 2008

(54) NON-UNIFORM TRANSMISSION LINE FOR REDUCING CROSS-TALK FROM AN AGGRESSOR TRANSMISSION LINE

(75) Inventor: Syed Asadulla Bokhari, Nepean (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/859,828

(22) Filed: May 16, 2001

(51) Int. Cl.
*H01P 3/08* (2006.01)

(52) U.S. Cl. ............... 333/1; 333/4; 333/34; 333/238; 333/246

(58) Field of Classification Search .............. 333/238, 333/246, 33, 34, 35, 1, 4
See application file for complete search history.

(56) References Cited

U.S. PATENT DOCUMENTS

| | | | | |
|---|---|---|---|---|
| 3,562,674 A | * | 2/1971 | Gerst | .......... 333/116 |
| 3,761,842 A | * | 9/1973 | Gandrud | .......... 333/1 |
| 3,883,828 A | * | 5/1975 | Cappucci | .......... 333/116 |
| 4,521,755 A | * | 6/1985 | Carlson et al. | .......... 333/246 X |
| 5,227,742 A | * | 7/1993 | Suzuki | .......... 333/1 |
| 5,777,526 A | * | 7/1998 | Kawasaki | .......... 333/1 |
| 6,040,524 A | * | 3/2000 | Kobiyashi et al. | .......... 333/1 X |
| 6,107,578 A | * | 8/2000 | Hashim | .......... 174/250 |
| 6,268,783 B1 | * | 7/2001 | Kamiya | .......... 333/238 |
| 6,577,211 B1 | * | 6/2003 | Tsujiguchi | .......... 333/238 X |

OTHER PUBLICATIONS

Islam, Saiful, "An Analysis and Design Technique For Microstrip Comblines"; *Microwave Journal*; Nov. 1987, pp. 79-91.*

* cited by examiner

*Primary Examiner*—Benny Lee
(74) *Attorney, Agent, or Firm*—Orion Law Group, PLC.; William E. Alford

(57) ABSTRACT

A non-uniform transmission line, including at least a first section with length L1, uniform width W1 and thickness h1, and a second section with length L2, uniform width W2 and thickness h2, joined together to form a composite structure and arranged in any of at least three distinct configurations. The composite structure (first section plus second section) may be periodic or non-periodic. Length and/or width and/or thickness of each of the two sections may be varied to provide desired values for characteristic impedance, cutoff frequency and/or time delay for signal propagation.

16 Claims, 8 Drawing Sheets

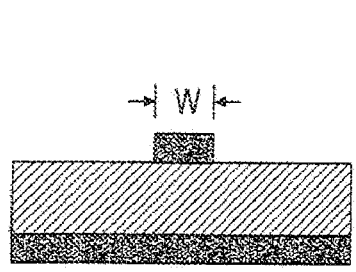
FIG. 1A
(Prior Art)
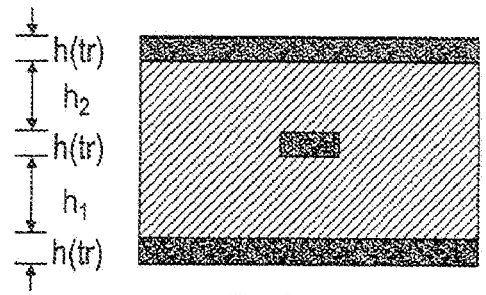
FIG. 1B
(Prior Art)
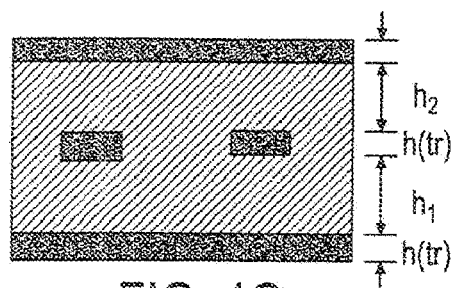
FIG. 1C
(Prior Art)
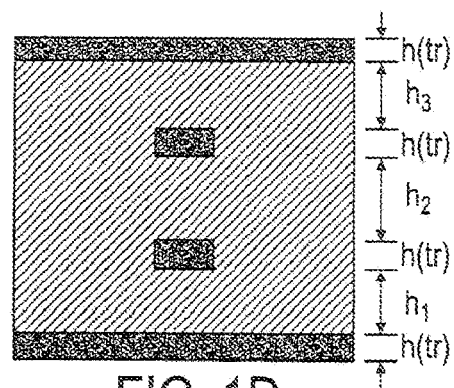
FIG. 1D
(Prior Art)
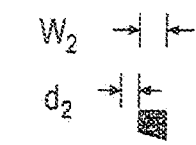
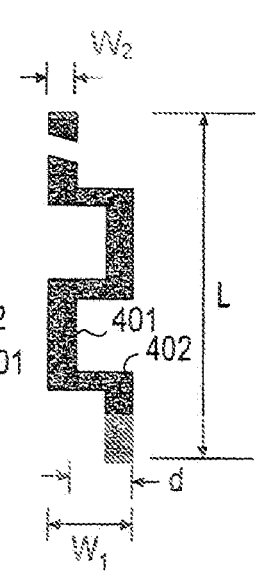
FIG. 3  FIG. 2  FIG. 4

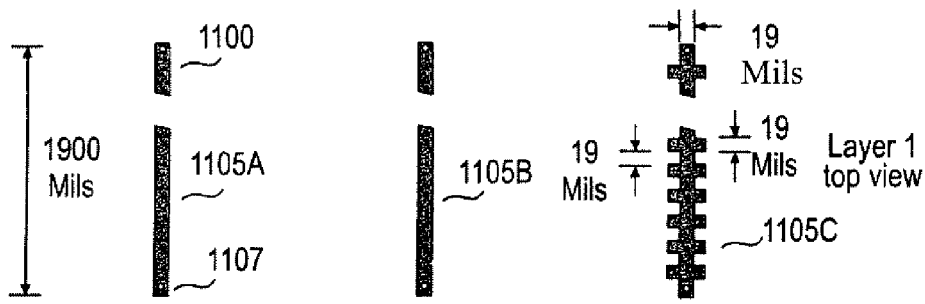
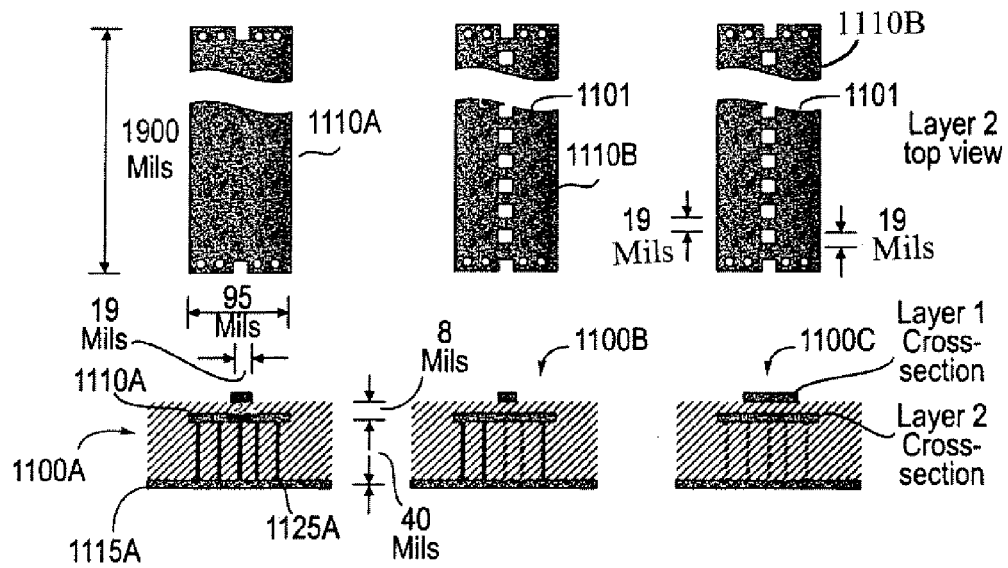
FIG. 11A   FIG. 11B   FIG. 11C
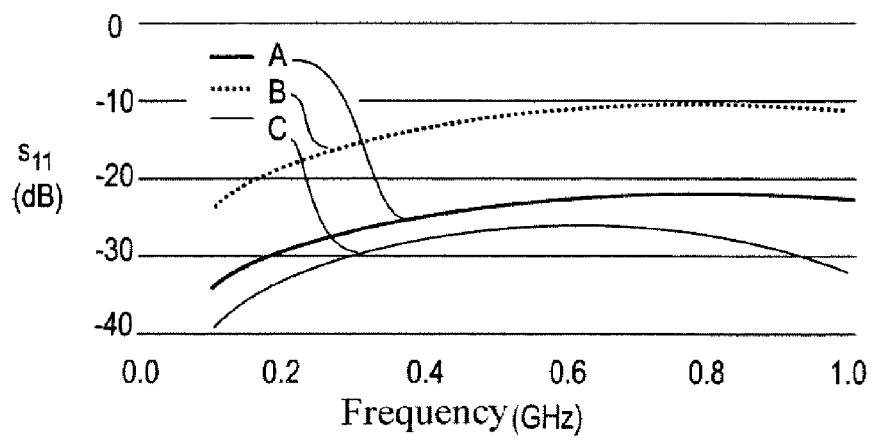
FIG. 12

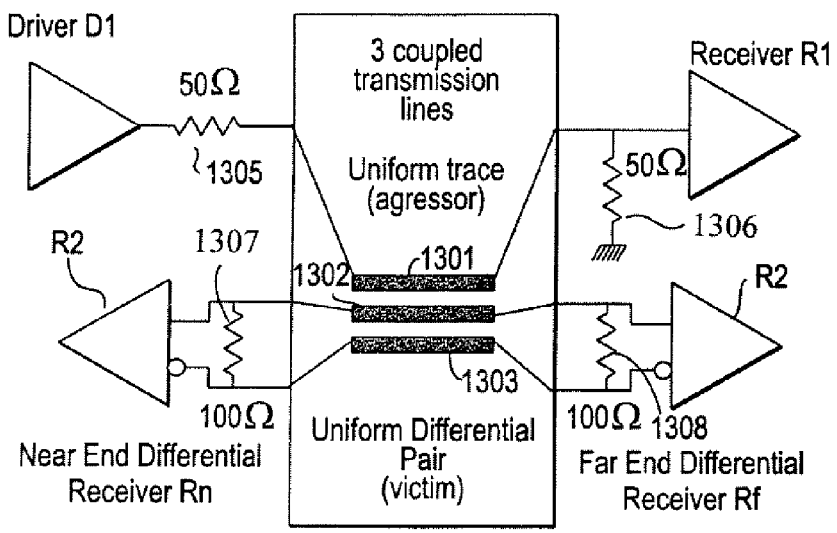
FIG. 13A
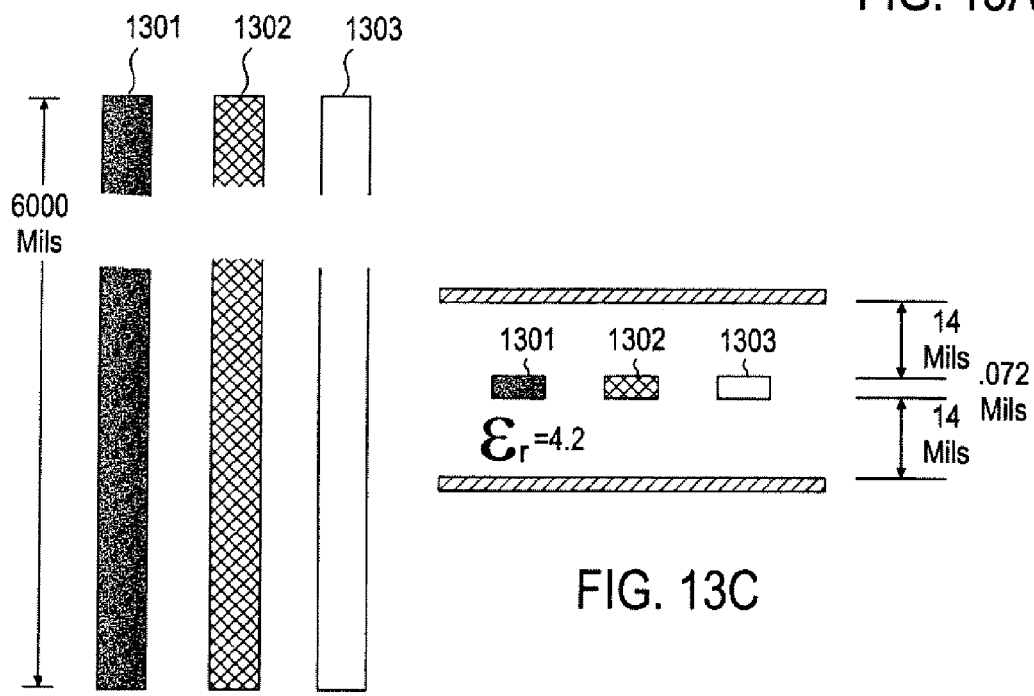
FIG. 13C
FIG. 13B

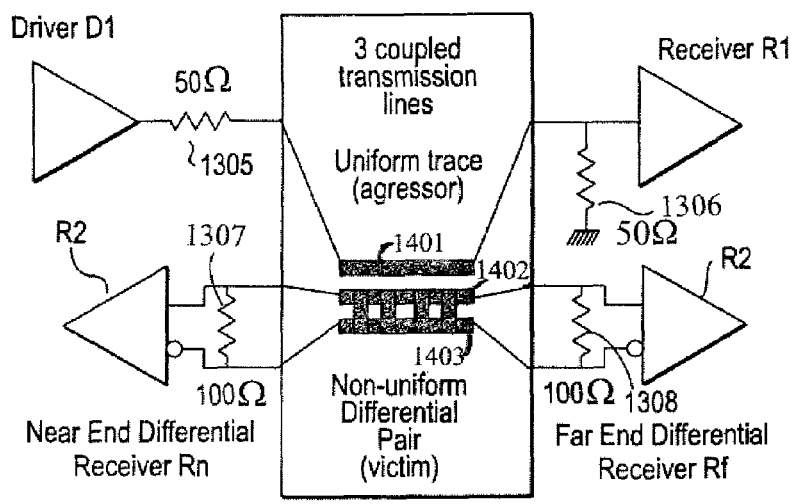
FIG. 14A
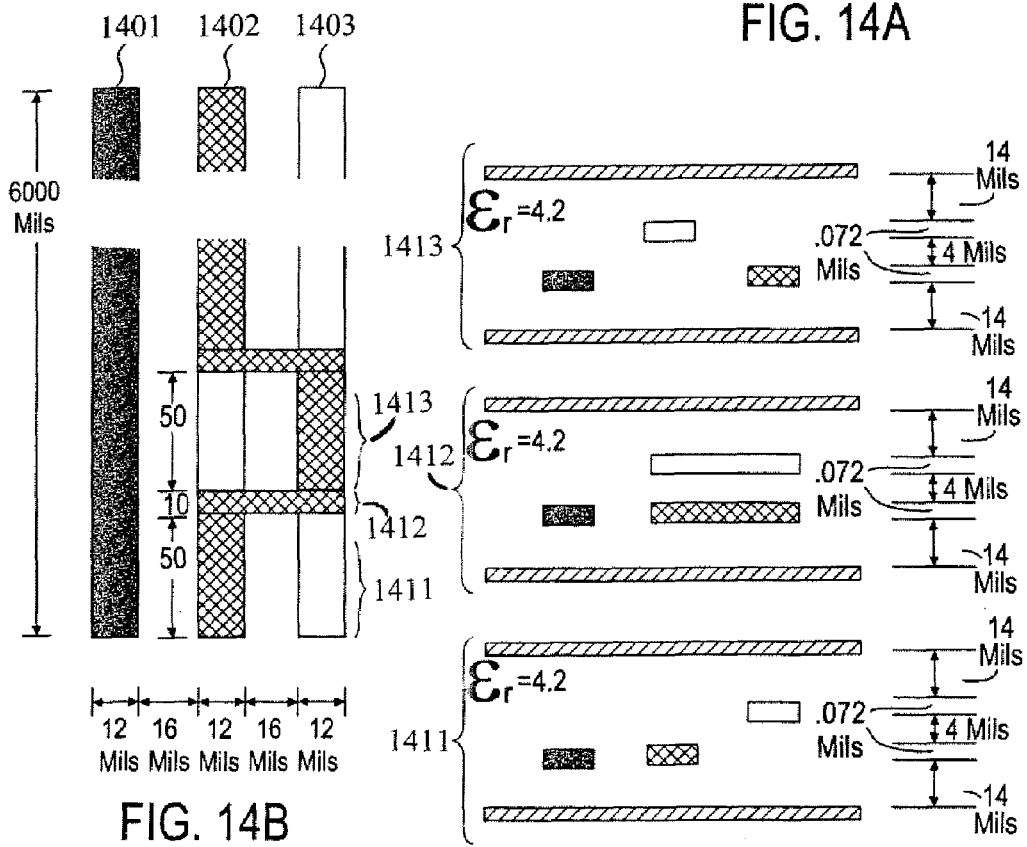
FIG. 14B
FIG. 14C

NON-UNIFORM TRANSMISSION LINE FOR REDUCING CROSS-TALK FROM AN AGGRESSOR TRANSMISSION LINE

FIELD OF THE INVENTION

This invention is related to transmission lines for high speed clock and data signals on printed circuit boards, multichip modules and integrated circuits.

BACKGROUND OF THE INVENTION

One common interconnect mechanism for transporting electronic signals on printed circuit boards, multichip modules and integrated circuits is a uniform width microstrip line or a uniform width stripline, as illustrated in FIGS. 1A and 1B. Such lines include a very low resistance signal transport line or "trace." One or two signal return planes, and an insulating dielectric material separating such lines from the return planes, are illustrated in FIGS. 1A and 1B. Two adjacent signal transport lines can be positioned adjacent (but not contiguous) and parallel to each other to provide coupled differential signal pairs, as illustrated in FIGS. 1C and 1D. For a high speed transmission line, having a broad "flat" bandwidth region, control of line impedance within the bandwidth region is crucial. Most signal integrity problems arise from improper impedance matching of signal drivers and receivers to a signal interconnect.

Where a uniform transmission line is used, several groups of parameters are available for controlling the characteristic impedance of the line: (1) thicknesses, h1, h2 and h3, of the dielectric layers; (2) width w of the trace; (3) dielectric permittivity $\in$ of the insulating substrate; (4) thickness h(tr) of the trace; and (5) electrical conductivity $\sigma$ of the trace. Commercial requirements often limit the choices of most. or all of these parameters. For example, most printed circuit boards (PCBs) are made of FR4 material so that one has little control of the dielectric constant of the insulating substrate or of the frequency dependence of the dielectric constant. Further, constraints on PCB packaging may severely limit the board thickness. Further, uniformly spaced traces, and traces spaced too close to each other, lead to signal cross-talk and other signal interference problems that limit bit rate and produce noise.

What is needed is an approach that provides additional parameters that allow control of impedance and/or signal interference of the transmission line. Preferably, this approach should not require that the traces be spaced far apart and should allow some freedom in control of frequency dependence of the trace of the trace impedance.

SUMMARY OF THE INVENTION

These needs are met by the invention, which provides a group of non-uniform transmission line structures that provide additional parameters for controlling characteristic impedance of the line. Each non-uniform line is a composite line of two (or more) sections formed with different length and width line dimensions, and each section is individually uniform. The two or more sections may be periodic within a composite line or may form a non-periodic non-uniform line. At least two length dimensions and at least two width dimensions are available to control impedance, cutoff frequency, time delay and other quantities of interest. Applications of the invention include construction of a hybrid differential pair of transmission lines, to reduce cross-talk, and provision of a signal trace having substantially constant characteristic impedance within a pin field.

BRIEF DESCRIPTION OF THE DRAWINGS

FIGS. 1A, 1B, 1C and 1D are end views of microstrip lines from the prior art.

FIGS. 2, 3 and 4 illustrate embodiments of non-uniform line structures according to the invention.

FIGS. 11A, 11B and 11C schematically illustrate uniform and non-uniform transmission line configurations of interest, with and without perforations in the ground plane.

FIG. 12 graphically compares frequency variation of a reflection coefficient computed using the configurations of FIGS. 11(A), 11(B) and 11(C).

FIGS. 13A, 13B, 13C, 14A, 14B and 14C illustrate a circuit used to show cross talk effects in uniform and non-uniform transmission lines.

DESCRIPTION OF BEST MODES OF THE INVENTION

Figure 5:
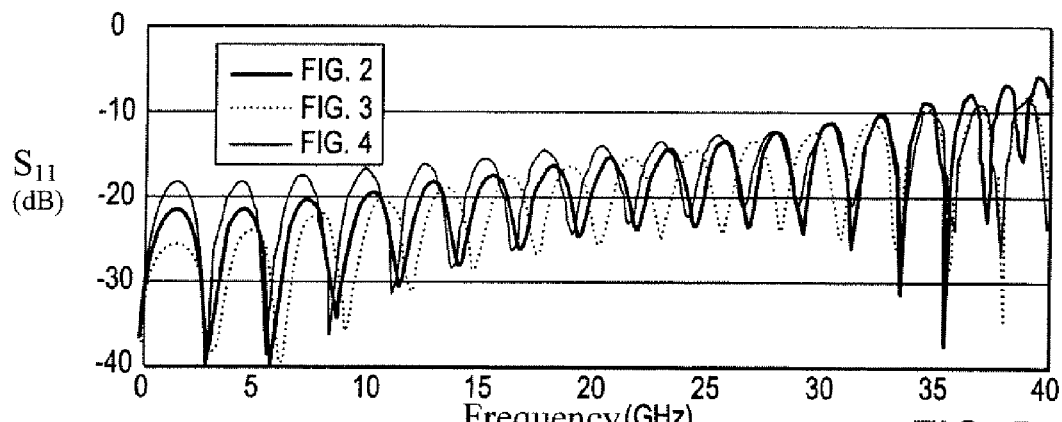
FIG. 5 graphically illustrates reflection coefficients computed for each of the line configurations shown in FIGS. 2, 3 and 4.

When a signal or group of electronic signals is to be transported from one point to another, a uniform width transmission line has usually been chosen, because such a line (1) is easy to analyze, (2) is easy to realize and (3) provides a response that is relatively independent of frequency, within a chosen frequency range. A non-uniform transmission line has been chosen, if at all, where the line must perform an additional task: a tapered line may be used to match impedances at an interface of two dissimilar lines; a corrugated waveguide may be used to equalize phase velocities of two dominant orthogonal modes in a waveguide and to provide a slow wave structure; and a line may be periodically loaded to provide desired filtering. In order to fully realize benefits from a non-uniform transmission line, at least one physical dimension of such a structure should be approximately one-quarter of a guide wavelength corresponding to a signal frequency used in the system; this constraint makes the line response strongly frequency dependent.

For transmission of digital signals, the line should have a large bandwidth, preferably extending from dc to several GHz. In one embodiment, the invention is a non-uniform transmission line that includes a sequence of individually uniform line sections having very small dimensions. The simplest embodiment of a non-uniform line, illustrated in FIG. 2, is a periodic symmetric structure having a first uniform trace section 201 of length L1 and width W1 and a second uniform trace section 202 having a length L2 and width W2, repeated one or more times along a central longitudinal axis as shown, where the second section 202 is transversely located symmetrically relative to the first section 201. More generally, the line structure shown in FIG. 2 need not be periodic. By setting W1=W2, one recovers a uniform transmission line. A non-uniform transmission line is analyzed by the following three methods: (1) a chain parameter matrix analysis, for lossy or lossless lines, in which all electrical parameter values abruptly change in moving from one section to another; (2) a time domain circuit analysis of the complete circuit, including the driver, the transmission line and the receiver; and (3) a mixed potential integral equation analysis using dyadic Green's functions and including a method of moments solution for the unknown current distribution on the trace. Details on use of method (1) are presented in an Appendix 1. A brief description of method (2) is presented in Appendices 2 and 3. Method (3) is briefly discussed in Appendix 4 and is discussed in greater detail in the reference cited in Appendix 4.

Where a chain parameter matrix analysis (CPMA) is used, each of the sections (1) and (2) is represented by 2×2 matrices $T_i$ (i=1, 2) with matrix entries $$\Phi 11(i) = \cos h(\gamma_i L_i) \ (i=1,2, \tag{1A}$$

$$\Phi 12(i) = -Z_{c,i} \sin h(\gamma_i L_i), \tag{1B}$$

$$\Phi 21(i) = -\sin h(\gamma_i L_i)/Z_{c,i}, \tag{1C}$$

$$\Phi 22(i) = \cos h(\gamma_i L_i), \tag{1D}$$

$$\gamma i = \{(r_i + j\omega \cdot l_i)(g_i + j\omega \cdot c_i)\}^{1/2}, \tag{2}$$

$$Z_{c,i} = \{(r_i + j\omega \cdot l_i)/(g_i + j\omega \cdot c_i)\}^{1/2}, \tag{3}$$

where l is an inductance, r is a resistance, g is a conductance and c is a capacitance, all per unit length, for the applicable section, (i=1 or i=2). Equation 2 for γi determines the propagation constant per unit length for the applicable section, (i=1 or i=2). Equation 3 for $Z_{c,1}$ determines the characteristic impedance per unit length for the applicable section, (i=1 or i=2).

The uniform section 1 of length L1 and width W1 can be connected to another uniform section 2 of length L2 and width W2 in a number of ways, as shown by the examples in FIGS. 2, 3 and 4. In FIG. 3, for example, the width W2 of the second section 301 is less than the width W1 of the first section 302. The first section 302 extends laterally beyond the second section by non-negative distances d1 and d2 on two sides, where $$W1 = W2 + d1 + d2. \tag{4}$$

The line configuration shown in FIG. 3 is referred to as a "non-symmetric (d1,d2)-transverse configuration. In the symmetric configuration shown in FIG. 2, d1=d2. The width relationship W1>W2 in FIG. 3 can be inverted so that W2>W1.

In FIG. 4, d1 is equal to zero, d2 is equal to a distance d, and the second section 401 has a width W2<W1 and is approximately parallel to, and transversely displaced by the distance d=W1−W2 from an adjacent first section 402 in an alternating manner, as shown. The configuration shown in FIG. 4 is referred to herein as a "d-transversely displaced" configuration. The width relationship W1>W2 can be inverted. The trace thickness h(tr) in FIGS. 2, 3 and 4 may vary from one section to the next, if desired, as an additional control variable.

As an example, consider the line structure shown in FIG. 2 with the following parameter values, with length units of mils: W1=10, L1=30, W2=30, L2=20, L=1000, N=1000/50=20, h1=8, $\epsilon_{rel}$=4.2, tan δ=0.01, σ=5.8×10$^7$ mhos. The line is assumed to be a microstrip, similar to the line shown in FIG. 1A. The s-parameters for this line structure are conveniently evaluated by exciting one end of the line with a linear source having internal impedance of 50 Ohms and terminating the other end of the line in a 50 Ohm load. This approach would be used to measure the s-parameters of a two-port device using a network analyzer. Because a non-uniform transmission line of the type described here is a broad band structure, it is difficult to define or identify a cut-off frequency. For purposes of illustration here, a cut-off frequency, $f=f_c$, is taken to be the lowest frequency for which the $s_{11}$ parameter is no greater than −10 dB. The $s_{11}$ parameter is directly related to the reflection coefficient or the Voltage Standing Wave Ratio (VSWR) for the configuration.

FIG. 5 graphically illustrates the calculated values for the $s_{11}$ parameter as a function of frequency using a mixed potential integral equation method (method 3). This analysis is rigorous and does not make any assumptions concerning transmission line behavior. The frequencies corresponding to maximum and minimum values of $s_{11}$ for the three line configurations shown in FIGS. 2, 3 and 4 shift relative to each other along the frequency axis and are not identical, except possibly for a few isolated frequencies. Thus, the three line configurations shown in FIGS. 2, 3 and 4 manifest different characteristics, although envelopes for the maxima of $s_{11}$ are approximately the same for these three configurations.

At low frequencies, the parameter $s_{11}$ depends upon the manner in which the uniform sections are connected to each other. Local minima of $s_{11}$ occur at frequencies where the total length of the line is equal to an integral multiple of a half guide wavelength. For these lengths, the load impedance is not transformed. Local maxima of $s_{11}$ occur at frequencies where the total length of the line is equal to an odd integral multiple of a quarter guide wavelength. For these lengths, the load impedance undergoes a quarter wave transformation. The peak values of $s_{11}$ increase as the frequency increases. This indicates that the characteristic impedance of the transmission line depends non-trivially on frequency. The spacing between two consecutive local minima or local maxima is a measure of the time delay of the line. The line configuration of FIG. 4 manifests a slightly larger time delay than the line configuration of FIG. 2. In the frequency range $0 \leq f \leq f_c$ the composite line configuration in FIG. 2 behaves similarly to a uniform line, with an overall characteristic impedance $Z_c$ that depends upon the characteristic impedances, $Z_{c1}$ and $Z_{c2}$, for the two sections of widths W1 and W2. Where the section lengths satisfy L1=L2, the effective characteristic impedance of the composite line Zc is approximately the geometric mean: $Z_c \approx \{Z_{c1} Z_{c2}\}^{1/2}$.

A composite line of length L introduces a time delay that is greater than the time delay for a uniform line of length L, and this additional delay depends upon L1, W1, L2 and W2. By choosing relatively small values for the length parameters, L1 and L2, the cutoff frequency can be made arbitrarily large. These dimension parameters can also be chosen to provide some control of the frequency response for the composite line. Some other characteristics of a composite line, such as loss, coupling between adjacent traces and radiation of energy, are qualitatively and quantitatively similar to the corresponding characteristics of a uniform line.

Figure 6A:
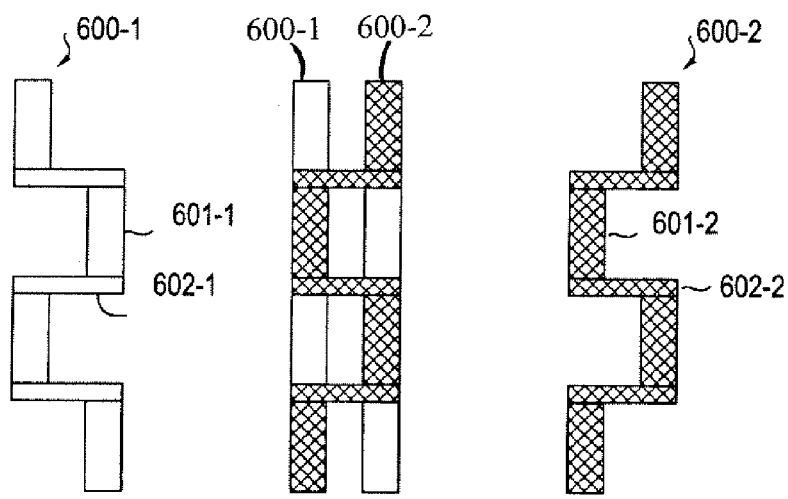
FIGS. 6A and 6B illustrates construction of a hybrid differential pair, using the embodiment shown in FIG. 4.
Figure 6B:
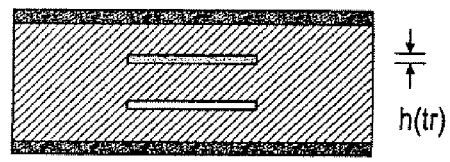

The embodiment shown in FIG. 4 can be reproduced, spaced apart by a selected transverse separation distance h(tr) (See FIG. 6B), and inverted about a central longitudinal axis to provide the structure shown in FIG. 6A (top view) and FIG. 6B (cross-sectional end view) in which distance h(tr) is depicted. This view provides a hybrid differential pair of lines and manifests a quasi-twisted pair effect that reduces cross-talk by an estimated 10 dB. Line structures 600-1 and 600-2, shown in FIG. 6A, have first sections 601-1 and 601-2, respectively, and alternatively, second sections 602-1 and 602-2, respectively.

The invention can be used to route one or more signal traces in a pin field. Ideally, such a trace will have a uniform characteristic impedance of 50 Ohms. However, because of the presence of holes in the ground plane due to the pins, the distributed capacitance of the trace decreases in the pin field and the net characteristic impedance of the trace increases, referred to as a "ground starvation effect" and verified experimentally by C. O. Sullivan and N. Lee, "Ground starvation effects on multi-layered PCBS", Proc. I.E.E.E., EMC Symposium, Washington, D.C., 2000, pp. 113-116. Further, a uniform trace in a non-uniform pin field, with pin density varying from region to region, will produce a characteristic impedance that varies from one region to another.

Figure 7:
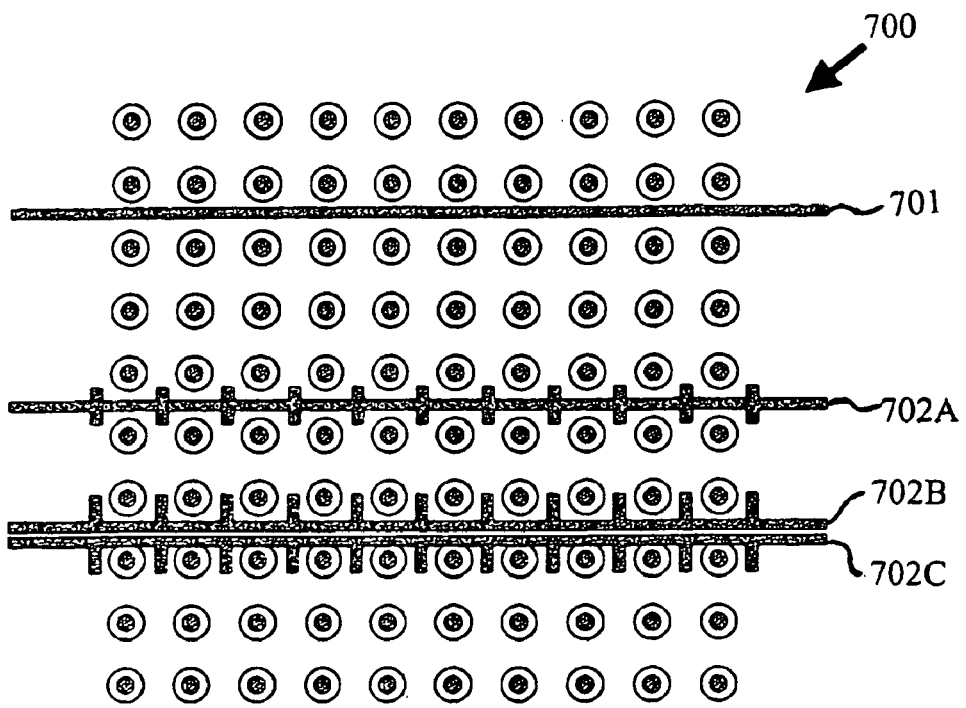
FIG. 7 illustrates use of the invention to maintain a desired characteristic impedance for a signal trace passing through a pin field.

The characteristic impedance of the trace can be decreased or increased by a controllable amount using any of the non-uniform transmission line configurations shown in FIGS. 2, 3 and 4. FIG. 7 illustrates traces 702A-702C that use the line configurations of FIG. 2 and/or FIG. 3 in a more-or-less uniform pin field 700 in contrast to the uniform trace 701. If the pin field is markedly non-uniform, having a much higher density of pins in a first region than in an adjacent second region, a non-uniform and non-periodic transmission line (trace) can be employed to provide a sub-trace within each of the first region and the second region with an approximately uniform characteristic impedance of about 50 Ohms.

Each of the three non-uniform line configurations of the invention (FIGS. 2, 3 and 4) provides a designer with at least four additional physical parameters (L1, W1, L2, W2) with which to control the characteristic impedance of a transmission line, while allowing the line itself to be fabricated relatively easily as an assembly of two contiguous sections, each of uniform width, joined in an alternating structure. In one embodiment (FIG. 4), two non-uniform lines can be configured as a differential pair, illustrated in FIGS. 6A and 6B, to further reduce cross-talk, relative to a uniform width line, by an estimated 10 dB. One or more of the embodiments can also be used to maintain a characteristic impedance of about 50 Ohms for a trace that passes through a pin field, as illustrated in FIG. 7. One or more of these embodiments can also be employed to provide a precise time delay for a given number of sections. The associated physical parameters can be chosen to control cutoff frequency and to provide a low pass filter. A non-periodic structure wherein at least one parameter of at least one of the two sections (1) and (2) varies from one composite section to the next, can also be employed to vary the filtering characteristics.

Figure 8:
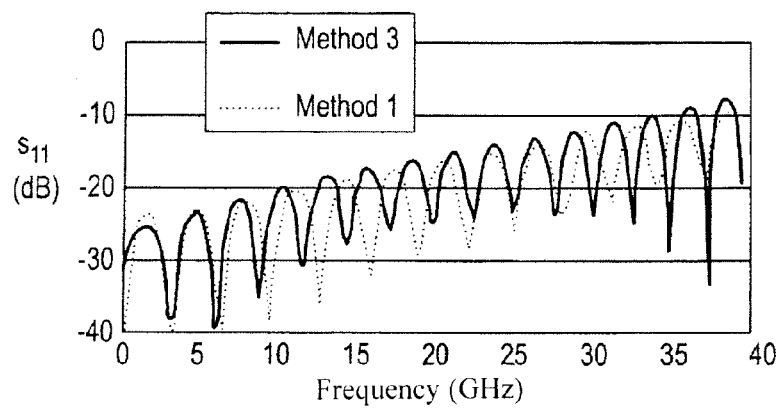
FIG. 8 graphically compares frequency variation of a parameter computed by two different transmission line analysis methods.

FIG. 8 graphically compares calculated values of the $s_{11}$ parameter for the symmetric configuration of FIG. 2, using the methods (1) and (3), versus frequency. The $s_{11}$ values for the methods (1) and (3) agree closely up to about 7.5 GHz. At higher frequencies, the observed disparity may arise from variation of the effective dielectric constant, which variation is only accounted for in the more accurate method (3). The envelope of the calculated $s_{11}$ values using method (1) provides a good approximation for the envelope associated with method (3).

Figure 9:
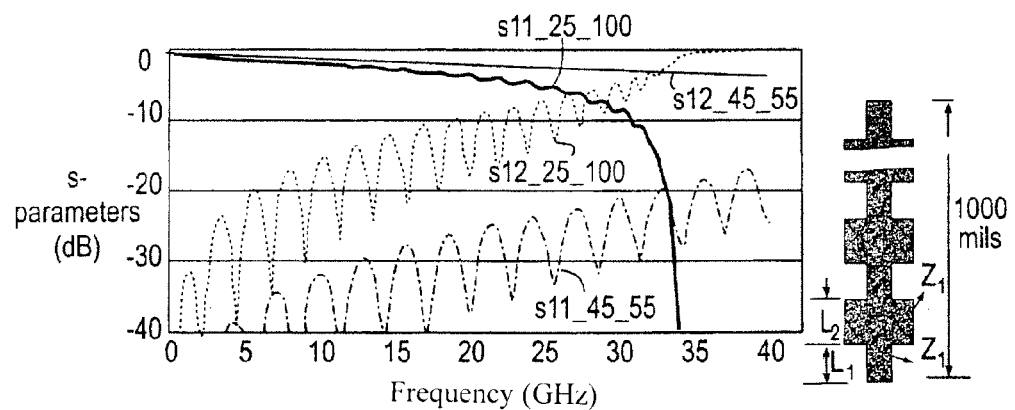
FIG. 9 graphically compares frequency variation of a parameter computed for two sets of impedance values.

Calculated values for the parameters $s_{11}$ and $s_{12}$ versus frequency are illustrated graphically in FIG. 9 for the configuration in FIG. 2, using method (1) and using equal section lengths (L1=L2=25 mils) and a total length of 1000 mils, with: (i) section impedances Z1=25 Ohms and Z2=100 Ohms; and (ii) section impedances Z1=45 Ohms and Z2=55 Ohms. The performance of the curve (i) degrades rapidly with increasing frequency. The curve (ii) corresponds to better performance (e.g., a higher value of cutoff frequency $f_c$) than the curve (i). The further apart the two impedances (Z1 and Z2) are designed to be, the smaller is the useful frequency range.

Figure 10:
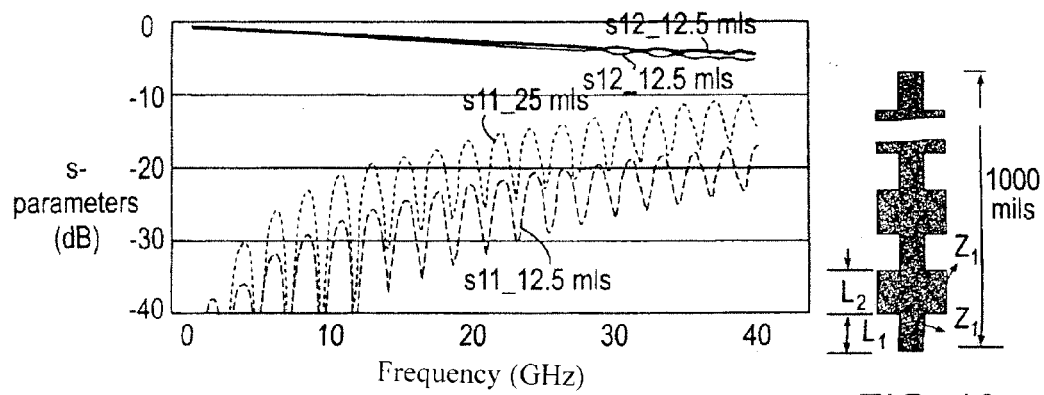
FIG. 10 graphically compares frequency variation of a parameter computed for two different sets of line section lengths.

Calculated values for the parameters $s_{11}$ and $s_{12}$ versus frequency are illustrated graphically in FIG. 10 for the configuration in FIG. 2, using method (1) and using section impedances Z1=25 Ohms and Z2=100 Ohms and a total length of 1000 mils, with: (i) equal section lengths of L1=L2=25 mils; and (ii) equal section lengths of L1=L2=12.5 mils. By reducing the length of each of the sections 1 and 2, the upper frequency limit $f_c$ is increased and performance is improved.

FIGS. 11A, 11B and 11C graphically illustrate three trace configurations, 1100A, 1100B, and 1100C, respectively, with and without perforations 1101 on the ground plane. The analysis in this case is carried out using method (3). A particular example is chosen so that a measurable effect on the impedance can be seen easily. It must be emphasized that, due to the numerical limitations of method (3), in particular, the need to solve a large, dense matrix equation, a coarse resolution of 19 mils is utilized for the cell size. Attention is confined to a microstrip configuration with $\in_{rel}$=4.2 and tan δ=0.01.

In FIG. 11A, a uniform microstrip trace (Layer 1) 1105A is located 8 mils above a finite size ground plane (Layer 2) 1110A. The uniform microstrip trace (Layer 1) 1105A is 1900 mils long. The finite size ground plane (Layer 2) 1110A is 1900 mils long and 95 mils wide. The dielectric substrate separating layers 1 and 2 has $\in_{rel}$=4.2 and tan δ=0.01. This configuration is placed symmetrically above an infinite grounded dielectric slab 1115A of thickness 40 mils. The dielectric substrate 1120A separating Layer 2 and the ground plane also has $\in_{rel}$=4.2 and tan δ=0.01. The currents on Layers 1 and 2 are determined simultaneously. Layer 2 serves as a local ground plane. In order for this to be valid, it is necessary that Layer 2 be tied to the ground plane by ground vias 1125A. A total of eight ground vias, indicated by the circles on Layer 2 in FIG. 11A, were used. An excitation is fed to Layer 1 by a first via 1106; and a second via 1107, indicated by the circles on Layer 1, provides a 50-Ohm load connection.

In FIG. 11B, the geometry is similar to that in FIG. 11A, the uniform microstrip trace (Layer 1) 1105B is 1900 mils long and the finite size ground plane (Layer 2) 1110B is 1900 mils long and 95 mils wide. Except that on Layer 2, the finite size ground plane 1110B is perforated directly under the trace of Layer 1 1105B by a sequence of square holes or perforations 1101 that represent vias as shown. The square holes or perforations 1101 may be 19 mils square and separated along the length of the finite size ground plane 1110B by 19 mils.

In FIG. 11C, the geometry is somewhat similar to that shown in FIG. 11B. The non-uniform microstrip trace (Layer 1) 1105C is 1900 mils long and the finite size ground plane (Layer 2) 1110B is 1900 mils long and 95 mils wide and includes the perforations 1101. The square holes or perforations 1101 may be 19 mils square and separated along the length of the finite size ground plane 1110B by 19 mils. As discussed previously with reference to FIG. 11B, the square holes or perforations 1101 in the finite size ground plane (Layer 2) 1110B are located directly under the trace of Layer 1, the non-uniform microstrip trace 1105C. However instead of a uniform microstrip trace 1105B, Layer 1 has a non-uniform microstrip trace 1105C as shown in FIG. 11C. The non-uniform microstrip trace (Layer 1) 1105C is 1900 mils long, with alternating sections approximately 19 mils wide along 19 mils of length and greater than 19 mils wide along 19 mils of length as illustrated.

FIG. 12 graphically compares variation with frequency of the $s_{11}$ parameter value of the transmission line on Layer 1 for the three configurations of FIGS. 11A, 11B and 11C. The upper frequency limit of 1 GHz was intentionally chosen to be less than the first resonant frequency for layer 2.

The result shown in curve (A) of FIG. 12 corresponds to the geometry of FIG. 11A. The perforations in the ground plane of FIG. 11B cause a significant degradation of $s_{11}$, as can be seen in curve (B). This is due to an increase in the effective characteristic impedance of the trace. By using a non-uniform trace, this degradation can be compensated, and the result is shown in curve (C).

To illustrate reduction of cross talk for a non-uniform trace, consider the circuit shown in FIG. 13A. Method (2) is utilized here, because a time domain result is desirable. The circuit includes three coupled stripline transmission lines 1301, 1302, and 1303, with all three being uniform, as shown in FIG. 13B. A first end of the first line 1301 in FIG. 13A is connected to an ideal, linear, single-ended driver D1 and to a series resistance 1305 of 50 Ohms. A second end of line 1301 is terminated in a 50-Ohm resistor 1306 connected to ground and to an ideal receiver R1. This part of the circuit is active and represents an "aggressor." The other two of the coupled three lines are used as a differential pair. This part of the circuit is inactive and represents a "victim." One objective is to determine a voltage induced at the near end and at the far end of the victim due to the aggressor's actions. The differential pair is connected to an ideal differential receiver R2 at each end and is terminated with 100-Ohm differential resistors 1307 and 1308. Excitation provided by the driver D1 is a 3.3 volt, symmetric, 50 percent duty cycle trapezoid with frequency 500 MHz. The 0-to-100 percent rise time is 100 picoseconds and is equal to the fall time. The circuit in FIG. 13A represents the reference circuit. FIGS. 13B and 13C illustrate a top view and a cross sectional view of the three traces 1301, 1302, and 1303, with dimensions stated in mils.

Exemplary dimensions for the three coupled transmission lines 1301, 1302, and 1303 illustrated in FIGS. 13A-13C are as follows. As illustrated in FIG. 13B a linear length of the three transmission lines 1301, 1302, and 1303 is 6000 Mils. At each end, the three transmission lines 1301, 1302, and 1303 are separated by a space or a gap that is 16 Mils. The width of the uniform traces 1301, 1302, and 1303 is 12 Mils over their entire lengths. As illustrated in FIG. 13C, the exemplary effective relative dielectric permittivity ($\in_r$ for a strip line) of the dielectric material separating the layers of the transmission lines and the ground planes is 4.2. An exemplary thickness for the three transmission lines 1301, 1302, and 1303 is 0.072 Mils. Transmission lines 1301, 1302, and 1303 appear to be at the same material layer. Transmission lines 1301, 1302, 1303 are separated from the lower ground plane by a dielectric having an exemplary thickness of 14 Mils. Transmission lines 1301, 1302, 1303 are separated from the upper ground plane by a dielectric having an exemplary thickness of 14 Mils.

FIG. 14A illustrates a circuit to show cross-talk effects in non-uniform transmission lines. FIGS. 14B and 14C illustrate a top view and a cross sectional view of the three coupled transmission lines 1401, 1402, and 1403. The circuit in FIG. 14A is somewhat similar to that in FIG. 13A. The first transmission line 1401 illustrated in FIG. 14A is a uniform trace that acts as an aggressor trace and has a first end connected to an ideal, linear, single-ended driver D1 through a series resistance 1305 of 50 Ohms. A second end of the first transmission line 1401 is terminated in a 50-Ohm resistor 1306 connected to ground and to an ideal receiver R1. This part of the circuit is active and represents an "aggressor." The other two transmission lines 1402 and 1403 are non-uniform transmission lines used as a differential pair that is inactive and represents a "victim." The differential pair (transmission lines 1402 and 1403) is connected to an ideal differential receiver R2 at each end (referred to as a near end differential receiver Rn at a near end and a far end differential receiver Rf at a far end) and is terminated with 100-Ohm differential resistors 1307 and 1308 at each end. Excitation is provided by the driver D1 to determine a voltage induced at the near end and at the far end of the victim due to the aggressor's actions. However transmission lines 1402 and 1403 represent a non-uniform differential pair as shown in detail in FIGS. 14B and 14C. As illustrated by FIGS. 14B and 14C, each of the transmission lines 1402 and 1403 has three different sections 1411, 1412, and 1413. Note that a cross sectional view of the non-uniform differential pair is different for each of the three different uniform sections 1411, 1412, and 1413. The r, l, g and c parameters for these sections 1411, 1412, and 1413 are evaluated separately, as described in Appendix 2.

Exemplary dimensions for the three coupled transmission lines 1401, 1402, and 1403 illustrated in FIGS. 14A-14C are as follows. As illustrated in FIG. 14B a linear length of the three transmission lines 1401, 1402, and 1403, excluding the distance to travel over the non-uniformity, is 6000 Mils. At each end, the three transmission lines 1401, 1402, and 1403 are separated by a space or a gap that is 16 Mils. The width of the uniform trace 1401 is 12 Mils over its entire length. From the bottom of FIG. 14B, the first uniform section 1411 is 50 mils in length, the second uniform section 1412 is 10 Mils in length, and the third uniform section 1413 is 50 mils in length. A first width in the first and third uniform sections 1411, 1413 of the transmission lines 1402, 1403 is 12 mils. A second width in the second uniform section 1412 of the transmission lines 1402, 1403 is 12 mils+16 mils+12 mils or 40 Mils total. As illustrated in FIG. 14C, the exemplary effective relative dielectric permittivity ($\in_r$ for a strip line) of the dielectric material separating the layers of the transmission lines and the ground planes is 4.2. An exemplary thickness for the three transmission lines 1401, 1402, and 1403 is 0.072 Mils. Transmission lines 1401 and 1402 appear to be at the same material layer in FIG. 14C while transmission line 1403 is on a different material layer. In all three uniform sections 1411-1413, transmission line 1403 is separated from the upper ground plane by a dielectric having an exemplary thickness of 14 Mils. In all three uniform sections 1411-1413, transmission lines 1401 and 1402 are separated from the lower ground plane by a dielectric having an exemplary thickness of 14 Mils. In all three uniform sections 1411-1413, transmission line 1401 is separated from the upper ground plane by a dielectric having an exemplary thickness of 14 Mils+4 Mils+0.072 Mils or about 18 Mils total. In the second uniform section 1412, transmission line 1403 is separated from transmission line 1402 by a dielectric having an exemplary thickness of 4 Mils. In the first and third uniform sections 1411, 1413, transmission line 1402 is separated from the upper ground plane by a dielectric having an exemplary thickness of 14 Mils+4 Mils+0.072 Mils or about 18 Mils total. In the first and third uniform sections 1411, 1413, transmission line 1403 is separated from the lower ground plane by a dielectric having an exemplary thickness of 14 Mils+4 Mils+0.072 Mils or about 18 Mils total.

Figure 15:
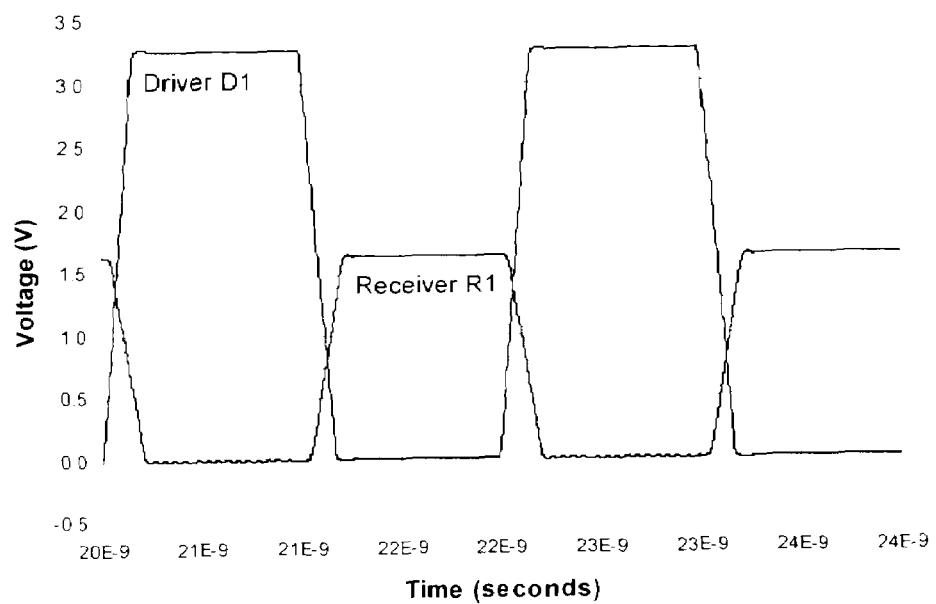
FIG. 15 illustrates time domain analysis waveforms at a driver and at a receiver for FIGS. 14A, 14B and 14C.
Figure 16:
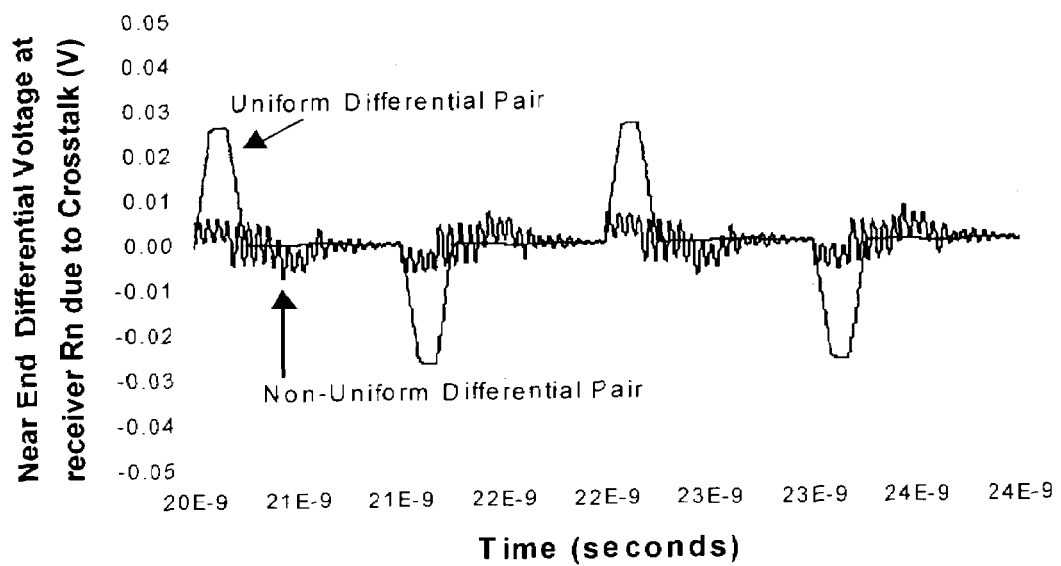
FIG. 16 illustrates cross talk waveforms for the circuits shown in FIGS. 13A, 13B, 13C, 14A, 14B and 14C.

The time domain analysis, method (2), was run for 12 cycles, and the results for the last two cycles are shown in FIGS. 15 and 16. A variable time step was used. The waveform resolution was 5 femtoseconds.

In FIG. 15, the time domain waveforms for the driver D1 and receiver R1 are shown for the circuit in FIG. 14A. These waveforms are approximately the same as waveforms for the circuit in FIG. 13A, except for a small ringing seen in the waveform at the receiver.

The near end cross talk differential voltage is the difference in the potential between nodes 1302 and 1303 for the circuit shown in FIG. 13A. The near end cross talk voltage exceeds the far end cross talk voltage, and the far end cross talk is not shown in FIG. 16. In FIG. 16, the induced voltage on the victim differential pair is reduced significantly (by about 11 dB), as compared to the induced voltage for a uniform differential pair. This result indicates that, for the same line-to-line spacing, a non-uniform differential pair will provide a cross talk voltage that is significantly less than the cross talk voltage for a corresponding uniform differential pair. Alternatively, for the same cross talk level, a non-uniform differential pair permits a closer pair-to-pair spacing than does a uniform differential pair.

APPENDIX 1

Chain Parameter Matrix Analysis

In a chain parameter matrix analysis (CPMA), a 2×2 matrix T, having four parameters, A, B, C and D, characterizes signal transport of a voltage-current pair (V(z), I(z)) along a coordinate axis z within a uniform component of a transmission line, and matrices are multiplied together to characterize signal transport within a consecutive group of such components. A transmission line component, illustrated in FIG. 2 or 3 or 4, having inductance l, resistance r, conductance g and capacitance c, all per unit length, and having a length L and a uniform width W, will have an associated transfer matrix $$T = \begin{matrix} A & B \\ C & D \end{matrix} \quad (A1\text{-}1)$$

$$A = \exp(-\gamma L), \quad (A1\text{-}2)$$

$$B = \exp(\gamma L), \quad (A1\text{-}3)$$

$$C = \exp(-\gamma L)/Z_c, \quad (A1\text{-}4)$$

$$D = -\exp(\gamma L)/Z_c, \quad (A1\text{-}5)$$

$$\gamma = \{(r+j\omega \cdot l)(g+j\omega \cdot c)\}^{1/2}, \quad (A1\text{-}6)$$

$$Z_c = \{(r+j\omega \cdot l)/(g+j\omega \cdot c)\}^{1/2}, \quad (A1\text{-}7)$$

where the development and the notation of C. Paul, *Analysis of Multiconductor Transmission Lines*, John Wiley & Sons, New York, 1994, pp. 186-194, is adopted. The parameters γ and $Z_c$ are referred to as the propagation constant and the characteristic impedance of the line component and will depend upon the length and width parameters, L and W, and upon the particular configuration adopted (e.g., that of FIG. 1A or 1B).

The chain parameter matrix entries themselves are determined from the relations $$\begin{matrix} V(L) = \Phi 11 & \Phi 12 \\ I(L) = \Phi 21 & \Phi 22 \end{matrix} \quad \begin{matrix} V(0) = \exp(-\gamma L) & \exp(\gamma L) & V+ \\ I(0) & \exp(-\gamma L)/Z_c & -\exp(\gamma L)/Z_c & V- \end{matrix}, \quad (A1\text{-}8)$$

$$\begin{matrix} V(0) = 1 & 1 & V+ \\ I(0) = 1/Z_c & -1/Z_c & V- \end{matrix}, \quad (A1\text{-}9)$$

where V(z) and I(z) are the equivalent voltage and current values associated with the line component for the coordinate value z, and V+ and V− are complex-valued, undetermined constants that incorporate certain initial conditions. The chain parameter matrix entries are determined to be $$\Phi = \begin{matrix} \Phi 11 & \Phi 12 \\ \Phi 21 & \Phi 22 \end{matrix} = \begin{matrix} \cosh(\gamma L) & -Z_c \sinh(\gamma L) \\ -\sinh(\gamma L)/Z_c & \cosh(\gamma L) \end{matrix} \quad (A1\text{-}10)$$

The total chain parameter matrix of a cascade connection of several two-port networks is expressed as an ordered product of the chain parameter matrices for the individual sections (S. Ramo et al, *Fields and Waves in Communication Electronics*, John Wiley & Sons, New York, 1994). For the line configuration shown in FIG. 2, the total matrix for an alternating concatenation of N first sections and N second sections, where N is a number of the respective sections, is expressible as $$\Phi(\text{total}) = \{\Phi 1 \cdot \Phi 2\}^N, \quad (A1\text{-}11)$$

$$\Phi 1 = \begin{matrix} \cosh(\gamma 1 \cdot L1) & -Z_{c1}\sinh(\gamma 1 \cdot L1) \\ -\sinh(\gamma 1 \cdot L1)/Z_{c1} & \cosh(\gamma 1 \cdot L1) \end{matrix}, \quad (A1\text{-}12)$$

$$\Phi 2 = \begin{matrix} \cosh(\gamma 2 \cdot L2) & -Z_{c2}\sinh(\gamma 2 \cdot L2) \\ -\sinh(\gamma 2 \cdot L2)/Z_{c2} & \cosh(\gamma 2 \cdot L2) \end{matrix}, \quad (A1\text{-}13)$$

where γ1, γ2, $Z_{c1}$ and $Z_{c2}$ are the propagation constants and characteristic impedances for the first and second sections.

The expression in Eq. (A1-11) is equated to a corresponding expression for an equivalent transmission line with equivalent propagation constant $\gamma_{\text{eff}}$ and equivalent characteristic impedance $Z_{c,\text{eff}}$, according to the relation $$\Phi(\text{total}) = \begin{matrix} \cosh(\gamma_{\text{eff}} \cdot L) & -Z_{c,\text{eff}}\sinh(\gamma_{\text{eff}} \cdot L) \\ -\sinh(\gamma_{\text{eff}} \cdot L)/Z_{c,\text{eff}} & \cosh(\gamma_{\text{eff}} \cdot L) \end{matrix}, \quad (A1\text{-}14)$$

$$L = N \cdot (L1 + L2). \quad (A1\text{-}15)$$

From Eq. (A1-14), one verifies that the equivalent characteristic impedance is determined by $$Z_{c,\text{eff}} = [\Phi 12(\text{total})/\Phi 21(\text{total})]^{1/2}, \quad (A1\text{-}16)$$

where Φ12(total) and Φ21(total) are the non-diagonal entries for the matrix Φ(total).

For the special case of N=1, L1=L2, and γ=γ2, the characteristic impedance is approximated by $Z_{c,\text{eff}} = [Z_{c,1} \cdot Z_{c,2}]^{1/2}$, which is reasonably accurate for low frequencies.

The entries for the matrix Φ(total) in Eq. (A1-14) can be determined numerically for moderate values of N (e.g., N≦20). Alternatively, the matrix Φ′=Φ1·Φ2 can be diagonalized by a 2×2 similarity transformation D, according to the relations $$(\Phi1 \cdot \Phi2) = D^{-1}(Diag)D, \quad (A1\text{-}17)$$

$$(\Phi1 \cdot \Phi2)^N = D^{-1}(Diag)^N D, \quad (A1\text{-}18)$$

$$Diag = \begin{matrix} \gamma1 & 0 \\ 0 & \gamma2, \end{matrix} \quad (A1\text{-}19)$$

$$Det\{\Phi1 \cdot \Phi2 - \gamma I\} = 0, \quad (A1\text{-}20)$$

and the matrix $\Phi$(total) can be determined for any choice of the positive integer N.

The s-parameters for the matrix $\Phi$(total) (e.g., with a target impedance of Z=50 Ohms) can be obtained from the chain matrix entries (S. H. Hall et al, *High Speed Digital System Design*, John Wiley & Sons, New York, 2000, Appendix D):

$$s_{11} = \{\Phi11 + \Phi12/Z - \Phi21 \cdot Z - \Phi22\}/\{\Phi11 + \Phi12/Z + \Phi21 \cdot Z + \Phi22\}, \quad (A1\text{-}21)$$

$$s_{12} = 2\{\Phi11 \cdot \Phi22 - \Phi12 \cdot \Phi21\}/\{\Phi11 + \Phi12/Z + \Phi21 \cdot Z + \Phi22\}, \quad (A1\text{-}22)$$

$$s_{21} = 2/\{\Phi11 + \Phi12/Z + \Phi21 \cdot Z + \Phi22\}, \quad (A1\text{-}23)$$

$$s_{22} = \{-\Phi11 + \Phi12/Z + \Phi21 \cdot Z + \Phi22\}/\{\Phi11 + \Phi12/Z + \Phi21 \cdot Z + \Phi22\}. \quad (A1\text{-}24)$$

Where a lossy line is present, the quantities $\gamma 1$, $\gamma 2$, $Z_{c,1}$ and $Z_{c,2}$ are complex. However, the imaginary component of $Z_{c,(1\ or\ 2)}$ is relatively small, and $Z_{c,1}$ and $Z_{c,2}$ are assumed to be frequency independent for some calculations in this simulation. For a uniform transmission line, the inductance per unit length l and the capacitance per unit length c are evaluated numerically using a method described in Appendix 2. The per unit length parameters describing losses (G. T. Lei et al, I.E.E.E. Trans. on Microwave Theory and Techniques, vol. 47 (1999) pp. 562-569) are estimated numerically. In the simulations using the chain parameter matrix method, the following approximations for a lossy propagation parameter that combines conductive losses and dielectric losses is utilized:

$\gamma = k_r - jk_i$, where $k_r$ and $k_i$ may be computed from:

$k_r = \omega\{\mu_0 \in_0 \in_{eff}\}1/2$, $k_i = (k_r/2)(\tan \delta + r/h)$, with $r = [2/\omega\mu_0\tau]^{1/2}$ (skin depth), h=distance between trace and return plane, $\omega = 2\pi f$, $\mu_0$=free space magnetic permeability ($4\pi \times 10^{-7}$ Henrys/meter), $\in_0$=Free space dielectric permittivity ($8.854 \times 10^{-12}$ Farads/meter), $\in_{eff}$=effective relative dielectric permittivity ($= \in_r$ for a strip line), tan $\delta$=dielectric loss tangent (assumed to be 0.01 here), $\theta$=trace electrical conductivity (in Siemens).

APPENDIX 2

Computation of l, c, r and g Parameters for a Transmission Line

One popular approach for computing the l, c, r and g parameters deals with a two-dimensional cross-section of a multi-conductor transmission line geometry. The Method Of Moments (R. F. Harrington, *Field Computation by Moment Methods*, Macmillan, New York, 1968; C. A. Balanis, *Antenna Theory—Analysis and Design*, John Wiley & Sons, 1982, New York, Chap. 7) solution for an integral equation approach is utilized in the present computation. One begins with Poisson's equation for computation of the [l] and [c] matrices. The dielectric and ground plane layers are accounted for by appropriate dyadic Green's functions. Through use of Green's functions, this computation becomes straightforward, and the matrix solution provides a matrix [c] for capacitance per unit length. The computation is repeated, setting $\in_r = 1$, to obtain a reference capacitance matrix $[c_0]$. The inductance matrix L is computed using $$[l] = \mu_0 \in_0 [c_0]^{-1}. \quad (A2\text{-}1)$$

Losses are incorporated using analytical expressions, as described in C. R. Paul, *Analysis of Multiconductor Transmission Lines*, John Wiley & Sons, New York, 1994, p. 179. For a single trace of width W and thickness $\tau$, the parameter r has values $$r = r_{dc} \quad (f < f_0) \quad (A2\text{-}2A)$$

$$= r_{dc}(f/f_0)^{1/2} \quad (f \geq f_0), \quad (A2\text{-}2B)$$

$$R_{dc} = 1/(\sigma W \tau), \quad (A2\text{-}3)$$

where $f_0$ is the lowest frequency at which the trace thickness is equal to the skin depth. The conductance matrix [g] is defined by $$[g] = \omega \tan \sigma [c]. \quad (A2\text{-}4)$$

APPENDIX 3

Time Domain Analysis

For high speed signal analysis, a time domain representation of the signals is necessary to evaluate signal reflections, cross talk, skew and similar features of a transmission channel. A frequency domain analysis has its own advantages, but some quantities of interest to the designer are best analyzed in the time domain. For example, the designer needs to evaluate the effect(s) of presence of noise on a switching threshold of a waveform. Two main concerns of a digital designer are whether a receiver is able to correctly interpret the 'ones' and 'zeroes' of a received signal and to ensure that the time delay of a data signal with respect to a clock signal is within an allocated margin.

The most successful time domain circuit simulation technique is implemented in an application language called SPICE and is discussed by J. Vlach and K. Singhal in *Computer methods for circuit analysis*, Van Nostrand Reinhold, New York, 1983. The SPICE method has evolved over many years, but the main idea, implemented in a version called SPICE2, has remained the same.

A typical electrical circuit includes passive elements (resistors, capacitors, inductors, transmission lines, etc.), active elements (transistors, diodes), and current and voltage sources. A complete circuit is identified as an interconnection of basic circuit elements between any two nodes. A modified nodal analysis (MNA), including an expression of Kirchoffs current law at every node except a ground node, is performed on the circuit. The currents through a branch and/or the voltage at a node are treated as time dependent variables $\psi(t)$ to be determined. A complete set of circuit equations can be written in compact form as $$M(\omega, \partial \omega/\partial t, t) = s(t), \qquad (A3\text{-}1)$$

where M is an MNA matrix and s(t) is a column matrix of known excitations. Every basic circuit element is represented by a "stamp," a small matrix that relates voltages and currents and is included in the matrix M.

Development of these entities for transmission lines is quite complex, especially for lossy lines. For a uniform, multi-conductor transmission line the analysis begins with a matrix formulation of the one-dimensional telegrapher's equations $$-\partial[v(z,t)]/\partial t = [L]\partial[i(z,t)]/\partial z + [R][i(z,t)], \qquad (A3\text{-}2)$$

$$-\partial[i(z,t)]/\partial t = [C]\partial[v(z,t)]/\partial z + [G][v(z,t)], \qquad (A3\text{-}3)$$

where [v(z,t)] and [i(z,t)] are vectors representing the voltages and currents at the external nodes of a transmission line and [L], [R], [C] and [G] are square matrices representing the inductance, resistance, capacitance and conductance (per unit length) parameters, as described in Appendix 2. Time domain analysis involves a representation of a multi-conductor transmission line in terms of a sub-circuit containing basic circuit elements and current and voltage sources for which "stamps" can be readily obtained. Equations (A3-2) and (A3-3) are a coupled set of partial differential equations that can often be decoupled using similarity transformations, for lossless lines. For lossy lines, a modal decomposition technique can be utilized, as discussed in C. R. Paul in *Analysis of Multi-conductor Transmission Lines*, John Wiley & Sons, New York, 1994, pp. 252-354.

Once an equivalent representation of a transmission line is obtained, a time domain solution of Eq. (A3-1) is performed. The complete time domain solution includes a dc solution and a transient solution. The dc solution is usually obtained by linearizing the nonlinear elements of the circuit, filling the MNA matrix for the entire circuit, and solving the resulting matrix equation iteratively. In a similar manner, the transient solution is obtained using numerical integration and a repeated solution of the dc circuit. Useful numerical techniques are well known and are discussed by R. M. Kielkowski in *Inside SPICE with CDROM*, McGraw Hill, New York, 1998.

APPENDIX 4

Mixed Potential Integral Equation Approach

A reasonably rigorous approach to antenna analysis, applicable to non-uniform transmission lines, presented by J. R. Mosig, R. C. Hall and F. E. Gardiol, "Numerical analysis of microstrip patch antennas", *I.E.E. Electromagnetic Wave Series*, J. R. James and P. S. Hall, eds., Peter Peregrinus, London, 1989, pp. 392-437, uses a mixture of scalar and vector electromagnetic potentials to obtain solutions for current(s) induced in one or more thin conductive patches mounted on a dielectric coated conducting ground plane. This approach uses a mixed potential integral equation (MPIE) analysis and a method of moments to determine the surface current(s).

The ground plane and substrate are assumed to extend to infinity in two transverse directions (x- and y-coordinate directions) and is assumed to, be non-magnetic, isotropic, homogeneous and (optionally) lossy. The z-coordinate is measured in the direction of the normal (perpendicular) to the ground plane. The patch is allowed to have Ohmic losses. An infinite dielectric (vacuum, air or other) with dielectric parameter $\in_1 = \in_0$ lies above the ground plane, which has a dielectric parameter $\in_2 = \in_0 \in_{rel}(1-j\cdot\tan\delta)$, where $\tan\delta$ is an associated loss tangent for the ground plane material. Excitation of the patch and ground plane is provided by a harmonic electromagnetic field $$F(t) = F0 \exp(j\omega t), \text{ where F0 is the initial value of F(t)}$$
$$\text{at time } t=0 \qquad (A4\text{-}1)$$

where F represents an excitation electric field $E_e$ and/or an excitation magnetic field $H_e$. The excitation field induces a diffracted or scattered field $E_J$ and/or $H_J$ in the patch. Maxwell's equations are applied to provide boundary conditions on patch surface; this includes induced currents J on the patch surfaces. The induced fields satisfy the homogeneous Maxwell equations $$\nabla \hat{\ } E_J = -j\omega\mu_0 H_J, \qquad (A4\text{-}2)$$

$$\nabla \hat{\ } H_J = j\omega \in E_J, \qquad (A4\text{-}3)$$

and are expressed in terms of a scalar potential V and a vector potential A as $$H_J = (1/\mu_0)\nabla \hat{\ } A, \qquad (A4\text{-}4)$$

$$E_J = -j\omega A - \nabla V, \qquad (A4\text{-}5)$$

subject to the Lorentz gauge condition $$\nabla \cdot A + j\omega\mu_0 \in V = 0. \qquad (A4\text{-}6)$$

The scalar and vector potentials satisfy homogeneous Helmholtz equations $$(\nabla^2 + k_i^2)V = 0, \qquad (A4\text{-}7)$$

$$(\nabla^2 + k_i^2)A = 0, \qquad (A4\text{-}8)$$

$$k_i^2 = \omega^2 \mu_0 \in_i (i=1, 2). \qquad (A4\text{-}9)$$

Figure 17:
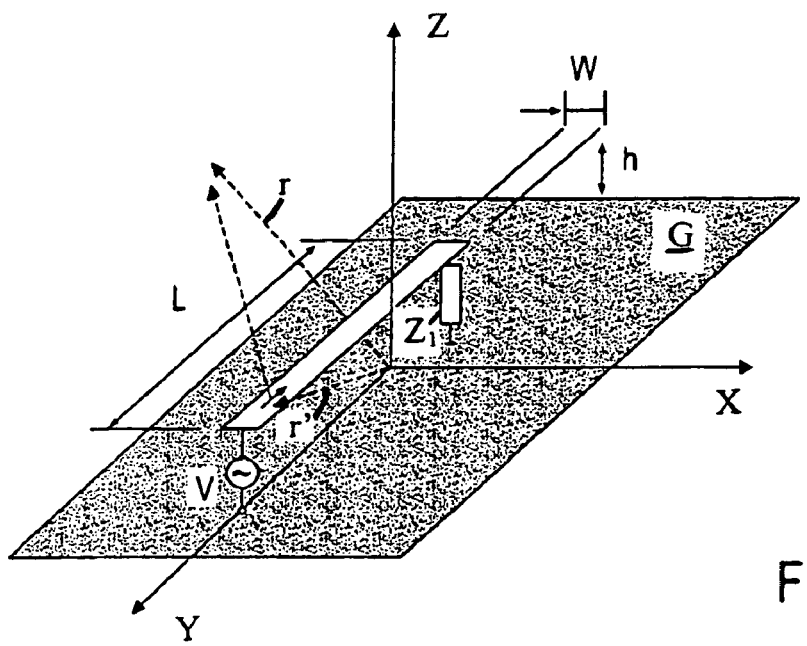
FIG. 17 illustrates a geometry used in connection with method (3).

FIG. 17 illustrates the configuration analyzed here, in which a patch or transmission line of length L, width W is deposited on a substrate of thickness h. The line is excited at a first end with a voltage source V and is terminated at a second end with a load impedance Z1. The s-parameters of the line are to be determined.

A current $J_s$ develops on the line surface satisfying a boundary condition $$e_z \hat{\ } (E_e + E_J) = e_z \hat{\ } (Z_s J_s), \qquad (A4\text{-}10)$$

where $e_z$ is a unit length vector oriented in the z-coordinate direction and $Z_s$ is a surface impedance that corresponds to conductor loss. One objective here is to determine the surface current distribution $J_s$ produced by the excitation field(s).

Equation (A4-10) is rewritten as $$e_z \hat{\ } (j\omega A + \nabla V + Z_s J_s) = e_z \hat{\ } E_e, \qquad (A4\text{-}11)$$

with $$A(r) = \int J_s(r') \cdot G(r;r') d^3 r', \qquad (A4\text{-}12)$$

$$V(r) = \int \nabla \cdot G(r;r') \cdot J_s(r') d^3 r', \qquad (A4\text{-}13)$$

where G(r;r') is a dyadic Green's function. The appropriate dyadic Green's function for this situation can be evaluate exactly in the (Fourier) frequency domain as Sommerfeld integrals. The required dyadic Green's functions are developed at pages 403-421 of the Mosig et al article. Numerical evaluation of the dyadic Green's functions in the spatial domain is facilitated by finding the poles and residues and using specialized algorithms for numerical integration. Equation (A4-11) can be rewritten in a compact form $$L\{J_s\}=E_e \text{(on surface)}, \quad (A4\text{-}15)$$

where $L\{\cdot\}$ is an integro-differential operator and the surface current $J_s$ can be decomposed as $$J_s = e_x J_x + e_y J_y', \quad (A4\text{-}16)$$

where $e_x$ and $e_y$ are unit vectors transverse to $e_z$. For simplicity, it is assumed here that the surface current is directed only parallel to the x-coordinate axis so that $J_y=0$. Equation (A4-15) then becomes $$L\{J_x\}=E_{e,x}\text{(on surface)}. \quad (A4\text{-}17)$$

The unknown current density $J_x$ is expressed as a series of known basis functions $F_n(r)$ multiplied by unknown coefficients $I_n$, $$J_x(r^1) = \sum_{n=1}^{N} I_n F_n(r^1), \quad (A4\text{-}18)$$

and a method of moments is applied to Eq. (A4-17). The symmetric inner product of Eq. (A4-18) with each of a sequence of known weighting functions $w_m(r)$ is then computed, and Eq. (A4-18) is transformed to $$\sum_{n=1}^{N} I_n \langle w_m, L\{F_n\}\rangle = \langle w_m, E_{ex}\rangle, \quad (A1\text{-}19)$$

Equation (A4-19) can be rewritten in matrix form as $$[W][I]=[G], \quad (A4\text{-}20)$$

where $[W]$ is an N×N matrix with known entries $W_{m,n}=\langle w_m, L\{F_n\}\rangle$, $[I]$ is an N×1 column matrix with as-yet-unknown entries $I_n$, and $[G]$ is an N×1 column matrix with known entries $\langle w_n, E_{e,x}\rangle$. If the matrix $[W]$ has a non-zero determinant, Eq. (A4-20) can be inverted to provide a solution for the coefficient matrix $[I]$:

$$[I]=[W]^{-1}[G]. \quad (A4\text{-}21)$$

One method, developed by Galerkin uses weighting functions $w_n(r')$ that are the same as the basis functions $F_n(r')$. However, this is not necessary here. The approach used here applies "rooftop" basis functions, which are two-dimensional functions that are triangular-shaped.

What is claimed is:

1. A non-uniform differential transmission line pair to reduce cross talk from an aggressor transmission line, the non-uniform differential transmission line pair comprising:
    a first transmission line on a first layer and a second transmission line on a second layer, each of the first transmission line and the second transmission line having
        a corresponding first transmission line section,
        a second transmission line section, and
        a third transmission line section,
        wherein the first transmission line section of each of the first transmission line and the second transmission line having a first end and a second end, having a first length L1, a first width W1 and a first line thickness h1, and containing an electrically conducting material,
        the second transmission line section of each of the first transmission line and the second transmission line having a first end and a second end, having a second length L2, a second width W2 and a second line thickness h2, and containing the electrically conducting material,
        the third transmission line section of each of the first transmission line and the second transmission line having a first end and a second end, having a third length L3, a third width W3 and a third line thickness h3, and containing the electrically conducting material,
        where the first end of each second section is joined to the corresponding second end of each first section and the first end of each third section is joined to the corresponding second end of each second section,
        where at least two of the following conditions are satisfied: the first length L1 is not equal to the second length L2, the first width W1 is not equal to the second width W2, and the first line thickness h1 is not equal to the second line thickness h2;
    a dielectric layer disposed between the first transmission line and the second transmission line, wherein the first transmission line and the second transmission line are positioned such that a quasi-twisted pair of transmission lines is effected with the first transmission line sections of the first and second transmission lines being in parallel and spaced apart by a selected transverse separation distance, the second transmission line sections of the first and second transmission lines being in parallel and overlapping each other, and the third transmission line sections of the first and second transmission lines being in parallel and spaced apart by the selected transverse separation distance; and
    a first ground plane over or under the first transmission line and the second transmission line.

2. The non-uniform differential transmission line pair of claim 1, wherein
    the first ground plane is over the first transmission line and the second transmission line; and
    the apparatus further comprises
        a second ground plane under the first transmission line and the second transmission line.

3. The non-uniform differential transmission line pair of claim 1, wherein
    the electrically conducting material is selected to have an electrical resistivity that is no greater than about $10^{-4}$ Ohm-cm.

4. The non-uniform differential transmission line pair of claim 1, wherein
    at least two of the following conditions are satisfied:
        the third length L3 is not equal to the second length L2,
        the third width W3 is not equal to the second width W2, and
        the third line thickness h3 is not equal to the second line thickness h2.

5. The non-uniform differential transmission line pair of claim 1, wherein
    the second transmission line section is coupled perpendicular to the first transmission line section, and
    the third transmission line section is coupled perpendicular to the second transmission line section.

6. The non-uniform differential transmission line pair of claim 5, wherein the third transmission line section is parallel to the first transmission line section.

7. An apparatus comprising:

a non-uniform transmission line having a plurality of first transmission line sections and a plurality of second transmission line sections,
  the first transmission line sections having a first end and a second end, having a length L1, a width W1 and a line thickness h1, and containing a selected electrically conducting material having an electrical resistivity that is no greater than about $10^{-4}$ Ohm-cm,
  the second transmission line sections having a first end and a second end, having a length L2, a width W2 and a line thickness h2, and containing the selected material, where the first end of the second section is joined to the second end of the first section,
  wherein the width W2 of the second transmission line sections is greater than the width W1 of the first transmission line sections;
a first ground plane of a finite size to substantially encompass the non-uniform transmission line and having a plurality of perforations, the first ground plane spaced apart and positioned symmetrically under and parallel to the non-uniform transmission line such that the plurality of perforations are directly under the non-uniform transmission line;
a first dielectric layer disposed between the non-uniform transmission line and the first ground plane;
a second ground plane under the first ground plane the second ground plane larger than the first ground plane to substantially encompass the non-uniform transmission line and the first ground plane; and
a second dielectric layer disposed between the first ground plane and the second ground plane, wherein the second dielectric layer has one or more ground vias to connect opposite ends of the first ground plane to the second ground plane.

8. The apparatus of claim 7 wherein
the length, width, and thickness of each of the first transmission line sections and the second transmission line sections are selected so as to compensate for an increase of an effective characteristic impedance of the non-uniform transmission line due to the plurality of perforations in the first ground plane.

9. The apparatus of claim 7, wherein
alternating pairs of the first transmission line section and the second transmission line section comprise an L like shaped transmission line portion and a mirrored L like shaped transmission line portion.

10. The apparatus of claim 7, wherein
the non-uniform transmission line further includes
  a third transmission line section coupled to a last one of the second transmission line section, the third transmission line sections similar to the first having a first end and a second end, having a length L1, a width W1 and the line thickness h1, and containing a selected electrically conducting material having the electrical resistivity that is no greater than about $10^{-4}$ Ohm-cm.

11. The apparatus of claim 7, wherein
each pair of the first transmission line section and the second transmission line section comprise a T like shaped transmission line portion.

12. A method for transmission of an electromagnetic signal, the method comprising:

providing an electromagnetic signal at a first end of a non-uniform transmission line and receiving the electromagnetic signal at a second end of the non-uniform transmission line, the non-uniform transmission line including
  a plurality of first transmission line sections having a first end and a second end, having a length L1, a width W1 and a line thickness h1, and containing a selected electrically conducting material having an electrical resistivity that is no greater than about $10^{-4}$ Ohm-cm,
  a plurality of second transmission line sections having a first end and a second end, having a length L2, a width W2 and a line thickness h2, and containing the selected material,
  wherein the first end of the second transmission line sections are joined to the second end of the first transmission line sections, and the width W2 of the second transmission line sections is greater than the width W1 of the first transmission line sections;
providing a first ground plane of a finite size to substantially encompass the non-uniform transmission line and having a plurality of perforations, the first ground plane spaced apart and positioned symmetrically under and parallel to the non-uniform transmission line such that the plurality of perforations are directly under the non-uniform transmission line;
providing a first dielectric layer disposed between the non-uniform transmission line and the first ground plane;
providing a second ground plane under and parallel with the first ground plane, the second ground plane larger than the first ground plane to substantially encompass the non-uniform transmission line and the first ground plane; and
providing a second dielectric layer disposed between the first ground plane and the second ground plane, wherein the second dielectric layer has one or more ground vias to connect opposite ends of the first ground plane to the second ground plane.

13. The method of claim 12, wherein
the length, width, and thickness of each of the first transmission line section and the second transmission line section are selected so as to compensate for an increase of an effective characteristic impedance of the transmission line due to the plurality of perforations in the first ground plane.

14. The method of claim 12, wherein
each pair of the first transmission line section and the second transmission line section form a T like shaped transmission line portion.

15. The method of claim 12, wherein
the non-uniform transmission line further includes
  a third transmission line section coupled to a last one of the second transmission line sections of the plurality of second transmission line sections, the third transmission line section similar to the first having a first end and a second end, having a length L1, a width W1 and a line thickness h1, and containing the selected electrically conducting material having the electrical resistivity that is no greater than about $10^{-4}$ Ohm-cm.

16. The method of claim 12, wherein
alternating pairs of the first transmission line section and the second transmission line section form an L like shaped transmission line portion and a mirrored L like shaped transmission line portion.

* * * * *